United States Patent
Masliah

Patent Number: 5,392,004
Date of Patent: Feb. 21, 1995

[54] COMBINATION AMPLIFIER/BIAS VOLTAGE GENERATOR

[75] Inventor: Denis Masliah, Saint-Germain-en-Laye, France

[73] Assignee: U.S. Philips Corporation, New York, N.Y.

[21] Appl. No.: 146,514

[22] Filed: Nov. 1, 1993

[30] Foreign Application Priority Data

Nov. 4, 1992 [FR] France ............................ 92 13244

[51] Int. Cl.[6] .............................................. H03F 3/16
[52] U.S. Cl. ...................................... 330/296; 330/277
[58] Field of Search ................. 330/277, 296, 302, 306, 330/310

[56] References Cited

U.S. PATENT DOCUMENTS

| 4,462,004 | 7/1984 | Cox et al. | 330/296 X |
| 5,041,796 | 8/1991 | Nambu et al. | 330/277 |
| 5,097,224 | 3/1992 | Madaffari et al. | 330/296 X |

FOREIGN PATENT DOCUMENTS

0203895 12/1986 European Pat. Off. .

OTHER PUBLICATIONS

IEEE Transactions of Electromagnetic Compatibility, vol. 16, No. 1, Feb. 1974, pp. 29–38, D. C. Surana et al "Gain and Distortion Properties of FET Mixers and Modulators".

Primary Examiner—Steven Mottola
Attorney, Agent, or Firm—Bernard Franzblau

[57] ABSTRACT

A circuit for processing an AC signal includes a first stage having a first active element biased with a first bias voltage ($V_{DD}$) applied between its first main electrode and its second main electrode. A second bias voltage ($V_G$) is applied between its control electrode and its second main electrode. The control electrode also receives the AC signal. This active element is of the type in which, normally, no bias current passes through the control electrode. The second DC bias voltage is generated at the terminals of a resistor coupled to the control electrode and to the second main electrode by applying to the control electrode an AC signal at a level which will activate the rectifier properties of the active element between its control electrode and its second main electrode.

20 Claims, 2 Drawing Sheets

COMBINATION AMPLIFIER/BIAS VOLTAGE GENERATOR

BACKGROUND OF THE INVENTION

This invention relates to an arrangement comprising a circuit for processing an AC signal which includes a first stage with a first active element biased with a first bias voltage applied between its first main electrode and its second main electrode, and with a second bias voltage applied between its control electrode and its second main electrode, the control electrode also receiving the AC signal and the active element being of the type in which, when in operation, normally no bias current flows in the control electrode.

The invention particularly finds its application in the realisation of semiconductor circuits operating in the very high frequency domain, e.g. in the field of telecommunications, in the range of consumer portable systems.

A power amplifier stage comprising field effect transistors is already known from the state of the art from U.S. Pat. No. 5,041,796. This stage is intended to form a broadband amplifier.

For this purpose, the active layer of the field effect transistor amplifier is modified relative to that of transistors habitually known to those skilled in the art. This modified layer presents a doping profile according to which the concentration of carriers is less strong near to the surface of the transistor and stronger as the distance to the surface becomes greater.

Said transistor is used with a bias arrangement which includes a resistor RG of 10 k$\Omega$ inserted between gate and ground, a resistor Rf of 300 $\Omega$ arranged in a series combination with a capacitor Cf of 50 pF inserted between its gate and drain, the load being constituted by an inductor placed between the drain and the positive DC power supply of 3 V, and the source of the transistor being connected directly to ground.

This transistor thus has the property of showing a constant transconductance as a function of the gate-source difference of potential; but it is not used for producing a DC potential of a different value from that of the DC power supply, which is +3 V, with a view to DC biasing various other stages of an integrated semiconductor circuit by means of this power amplifier stage.

Up till now a technical problem has arisen when one wishes to supply DC power to integrated semiconductor circuits of small portable systems, or of any consumer oriented and not very costly system. In these systems it is desirable to have only a single DC power supply for the system, for example, provided by 3 V batteries, and to generate in the circuit itself a second, negative, DC power supply which is necessary for the operation of further stages comprising the field effect transistors.

Up till now it has been known to those skilled in the art that an inverter stage may be used for generating a negative DC voltage from the +3 V DC supply voltage. This inverter stage carries out a sampling procedure while creating a high frequency AC signal having an amplitude between 0 and +3 V of a square wave shape. In response to this sampled signal a second shifting stage placed at the end of the inverter stage shifts the AC signal, which has an amplitude of 0 to 3 V by making the +3 V level correspond to ground, which brings the level which previously was 0 to a voltage of −3 V. In this manner a sampled signal between 0 and −3 V is produced which can generate a negative DC voltage of −3 V. The drawback is that this sampled signal has very steep edges and that it produces in fact all the multiples of the sampling frequency. This makes it necessary, in order to eliminate these highly annoying harmonics in the operation at high and very high frequencies, to add to this negative voltage generator circuit a filter whose structure is very sophisticated that is to say complex and costly.

Generally, it is a difficult problem to generate a second voltage having an opposite polarity to that of a first DC supply voltage or having a different value from that of this voltage in a high frequency or very high frequency integrated circuit, and a large number of circuits is involved in the solution to this problem.

In effect, in integrated circuits it is very often necessary to have two opposite-sign DC voltages to bias the transistors in each stage of the circuit. In the particular domain of very high frequency circuits to be applied to telecommunications, portable and consumer systems have appeared more and more, which systems are also required to be compact, that is to say, made with as small a number of elements as possible. They are to be highly reliable, not costly and, above all, simple, that is to say, operating with a single battery, thus having a single input for the DC power supply, but nevertheless operating with as good a performance if not better than the cumbersome sophisticated and costly circuits.

SUMMARY OF THE INVENTION

The present invention proposes a solution to this problem by means of an arrangement as defined in the opening paragraph and furthermore characterized in that the second DC bias voltage $V_G$ is generated at the terminals of a resistor R coupled to the control electrode and to the second main electrode by applying to the control electrode an AC signal which is powerful enough to activate the rectifier properties of the active element between its control electrode and its second main electrode.

This arrangement has the advantage that the second DC voltage can be generated in a single stage that includes a limited number of components. Moreover, the filter which is desirably used for eliminating the AC signal and which helps in generating the second negative DC voltage will not be a costly and sophisticated filter but, on the contrary, will be a simple and inexpensive filter.

In one embodiment this arrangement is characterized in that the generator of the AC power signal to be applied to the control electrode of the active element is the generator itself of the operating frequency AC signal.

In the case this operating frequency AC signal applied to the input of the circuit itself saturates the active element of this first stage, which is also fed with said first DC supply voltage. Although this signal certainly undergoes a transformation; but the output signal of the stage is perfect at the fundamental frequency and only the harmonics are annoying. However, these harmonics are not situated in the operating frequency band of the system and so they will be eliminated by a later filtering which is easy to perform.

In a variant of the above embodiment, the arrangement is characterized in that the AC power signal generator for influencing the control electrode of the active element is an auxiliary generator.

The advantage is that in this case too a simple and not very costly filter can then be used to eliminate or suppress the signal from the auxiliary source which, because of its frequency, is slightly annoying.

Another advantage of this variant of the embodiment is that in this case the power of the operating frequency AC signal may be any power level and even a variable level. In contrast, in the first embodiment the operating frequency AC signal should have a constant power, the advantage in the latter case being the simplicity of use.

In all of the cases the circuits are simple and reliable, not very cumbersome, not very costly and certainly compatible with the constraints of the portable and widely available arrangements. Since the annoying harmonics are easy to eliminate, the circuits will be of better quality than the known circuits.

BRIEF DESCRIPTION OF THE DRAWINGS

The invention will be described in detail hereinafter with reference to the appended drawings, in which.

DESCRIPTION OF THE PREFERRED EMBODIMENTS

With reference to one of the FIGS. 1a or 1b there will be described hereinafter, by way of non-limiting example, a circuit comprising a first stage called a bias stage, generator of a negative DC voltage, wherein, this stage is further supplied with a positive DC voltage of +3 V, applied to a first terminal $V_{DD}$ and produced by means which are external to the circuit.

This first stage comprises a first active element, for example, a transistor T which is, in essence, a power transistor. This transistor is itself biased with respect to the DC power supply $+V_{DD}$ by a large resistor R inserted between its gate G and a second terminal $V_{SS}$ which is ground in this example. The drain D is connected through a load L to the terminal $V_{DD}$ to which the positive DC power is supplied; and its source S is directly connected to the second ground terminal $V_{SS}$.

The drain load L may be a resistor, for example. But preferably when the circuit processes a high or very high frequency signal an inductor L will be used as the load. Such an inductive load L has the advantage that it does not create a voltage difference between the drain D and the positive DC power supply $V_{DD}$, so that the entire positive DC voltage appears on the drain D of the transistor. With such an inductive load, the drain D of the transistor thus aim has the +3 V DC voltage.

On the other hand, operating in the AC mode, the purely inductive load L isolates the output of transistor T on drain D at point 0.

As a result, the power transistor T can develop a larger power than if the drain were to receive a smaller DC voltage (which is the case with a resistive load), since at the terminals of transistor T there is present the undiminished +3 V.

This stage may further comprise a capacitor C to decouple the DC power supply $V_{DD}$. This capacitor is located between the supply line $+V_{DD}$ and ground. This capacitor is particularly useful when the +3 V DC voltage of $V_{DD}$ is led to the stage concerned by means of a long conductor, that is to say, when the supply means supplying +3 V is remote from this stage. This capacitor thus makes it possible to establish the short-circuit of the inductive load L better in the AC mode.

The operation of the stages shown in FIGS. 1 will be described hereinafter with reference to FIG. 2.

Figure 2:
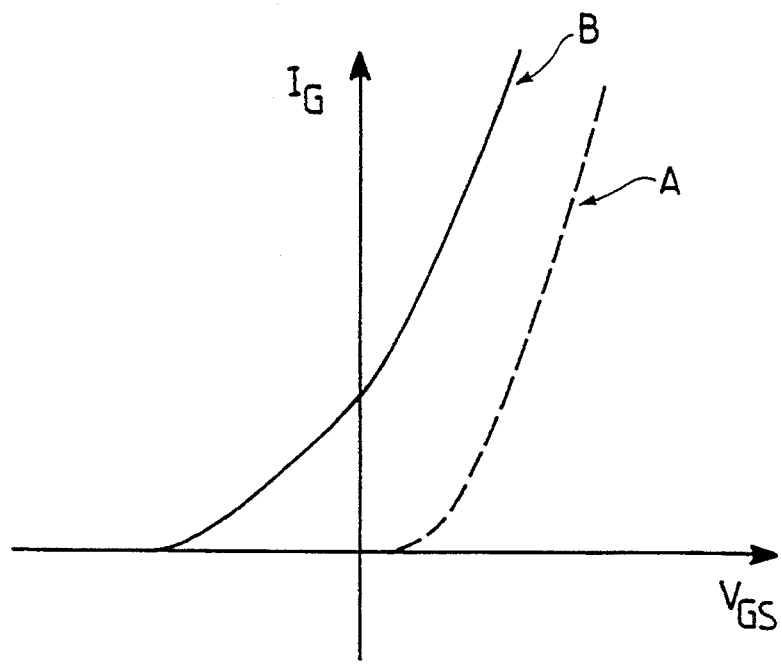
FIG. 2 represents in a broken line in curve A the characteristic $I_G$ plotted against $V_{GS}$ of an unsaturated power transistor and, in an unbroken line in curve B the characteristic $I_G$ plotted against $V_{GS}$ of a power transistor saturated by an AC input signal.

The dashed curve A in FIG. 2 shows the characteristic $I_G$ plotted against $V_{GS}$ (gate current Io plotted against gate-source voltage $V_{GS}$), in the case where such a stage comprising the power transistor T receives only an AC signal $V_{IN}$ of a low power level, which signal is applied to point E.

This curve shows that in this case no leakage current occurs on the gate, that is to say, that the gate current $I_G$ is substantially zero, for example, of the order of pA. The difference of potential at the terminals of the resistor R located between the gate and source, if this resistor is of the order of 10 kΩ, is of the order of $10^{-7}$ V, which can be completely disregarded.

However, with respect to the FIGS. 1, if a powerful AC signal $V_{In}$ is applied to node 1 then on the gate G of the transistor T, which is DC-isolated by the capacitor $C_1$, the characteristic $I_G$ plotted against $V_{GS}$ becomes the one shown as a solid line in curve B of FIG. 2. On the gate G there appears a non-zero current $I_G$. When the signal $V_{IN}$ is powerful and the transistor T is saturated, a gate current starts to be generated. The more powerful the signal $V_{IN}$ is, the larger the gate current $I_G$ is. The gate current may in this case easily attain a value of the order of 10 μA.

Figure 1A:
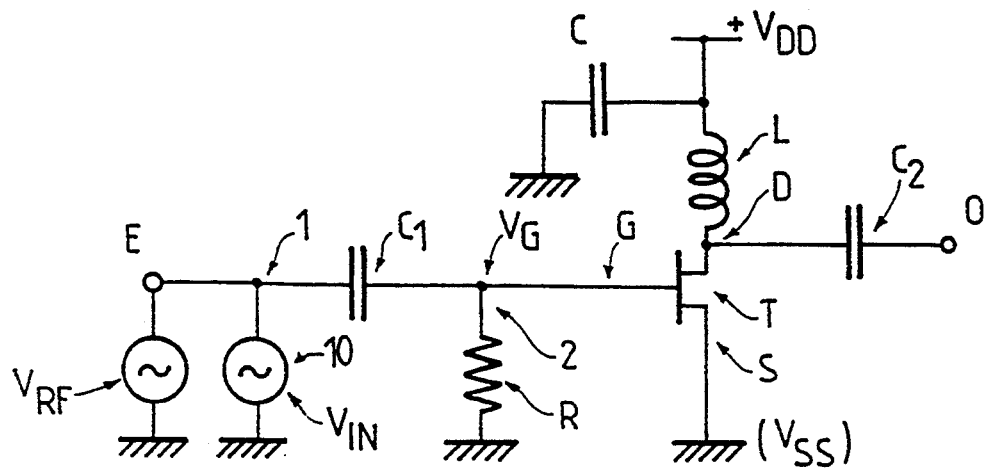
FIG. 1a diagrammatically shows a stage operative as a bias generator of a second DC voltage of opposite sign to that of its supply voltage, which employs an auxiliary AC signal which has a different frequency from the frequency of the operating frequency AC signal.
Figure 1B:
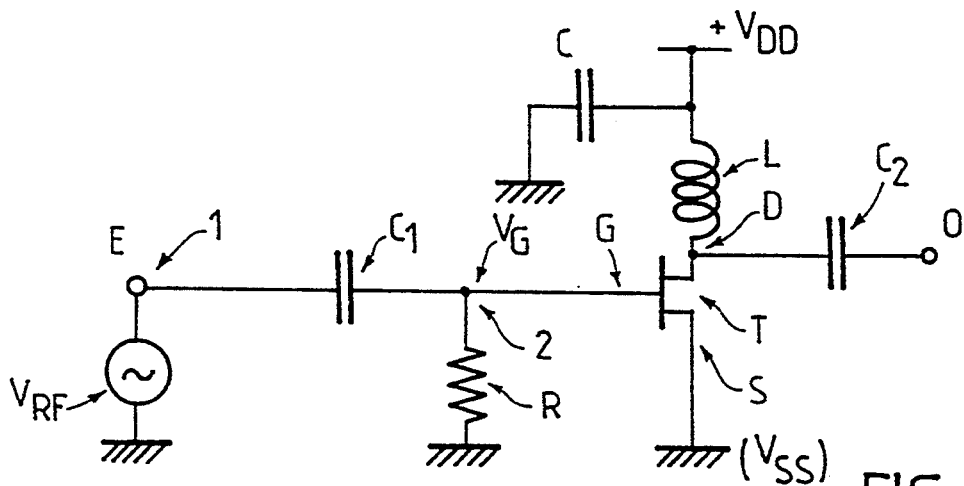
FIG. 1b diagrammatically shows such a bias stage, in this case using the operating frequency AC signal itself.

As a result, a negative difference of potential between ground and point 2 of the stage shown in the FIGS. 1a and 1b appears at the terminals of the power resistor R. The point 2 is called a bias point. If R=10 kΩ, the negative DC voltage at point 2 may be of the order of:

$$V_G = -1 \text{ V}.$$

Figure 3:
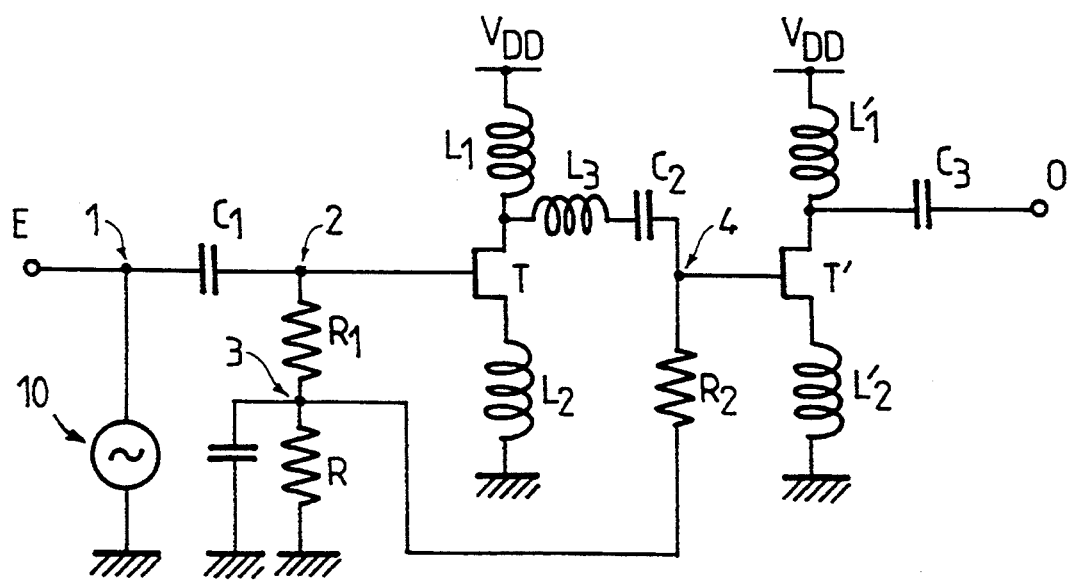
FIG. 3 represents an example of a circuit supplied with DC power by an external positive DC power supply means and of the negative DC voltage generated by an integrated bias circuit such as that described with reference to FIG. 1.

This generated negative voltage can thus be tapped between the node 2 and ground, and can be used for biasing the gates of the transistors of further stages which form a high frequency or a very high frequency integrated circuit such as that shown in FIG. 3. A power generator stage having a voltage $V_G$ of opposite sign to that of the DC supply voltage $V_{DD}$ while a power signal is compressed will hereinafter be called a bias circuit generated by power signal compression.

FIG. 1a shows an example of an embodiment of the bias stage. In the case of FIG. 1a the AC power signal $V_{IN}$ is produced by an auxiliary generator 10 which produces this AC signal at a frequency that is lower or is low relative to that of the operating frequency signal of the bias circuit, which operating frequency signal will be referenced $V_{RF}$ hereinafter.

With this structure the frequency of the auxiliary signal $V_{IN}$ causes interference, but without causing trouble with that of the operating frequency signal, called useful signal $V_{RF}$, which is applied to the input E of the circuit. The auxiliary signal is then eliminated by filtering in a simple filter stage located at the end of the bias stage, which is a negative voltage generator. This filter stage may comprise any simple filter known to those skilled in the art as being appropriate for this purpose. Thus, this known filter has not been described herein. The advantage of this structure employing the auxiliary signal $V_{IN}$ is that the useful signal $V_{RF}$ may have any power level. This level may be low, constant or variable. The only conditions for getting the bias stage to operate are to have a power transistor T and an auxiliary signal $V_{IN}$ which is capable of saturating the transistor T with a different frequency and a preferably lower frequency than the useful frequency of the useful signal $V_{RF}$. A lower frequency is preferably chosen because it is simpler to generate.

FIG. 1b shows another example, that is to say, a different embodiment of the bias stage. In the case of FIG. 1b the AC power signal comprises the useful signal $V_{RF}$ itself, provided that it is capable of saturating the power transistor T. The AC signal $V_{RF}$ having the useful frequency is then completely appears again on drain D of the transistor T, but it is influenced by harmonics. These harmonics, which have frequencies exceeding the useful frequency, are thus easily eliminated by a simple filter whose structure is chosen from the structures known to a person skilled in the art as being appropriate for this purpose. This filter will thus not be described here.

Figure 1C:
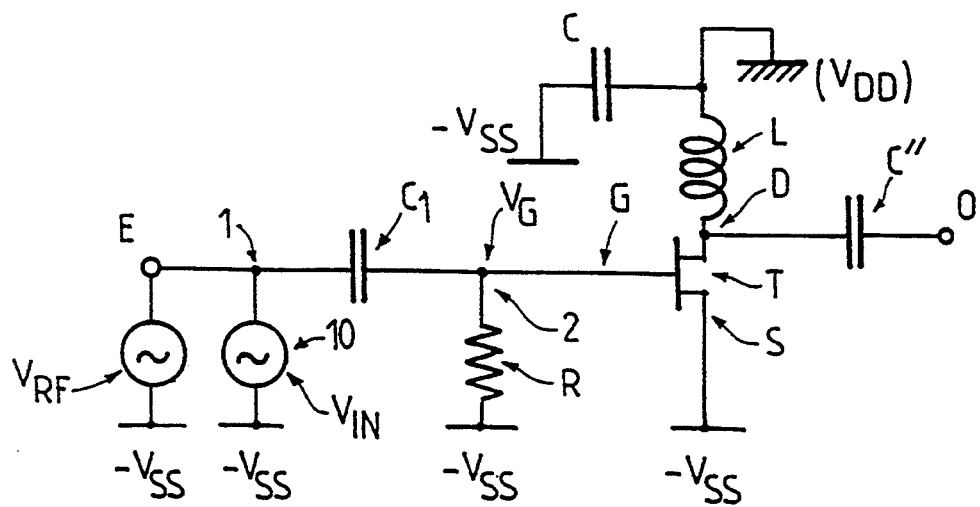
FIG. 1c diagrammatically shows a bias generator stage of a second DC voltage which is more negative than its source bias voltage.

In a variant of the circuits described with reference to the drawing in FIGS. 1a and 1b, which variant is illustrated in FIG. 1c, a DC voltage may be generated having a different value from that of the supply voltage and having a lower level, that is to say, in this case, more negative.

The circuit shown in FIG. 1c is practically the same as that shown in FIG. 1a (it could also function like that shown in FIG. 1b). The essential difference in FIG. 1c is that the first terminal $V_{DD}$, in lieu of the positive DC supply voltage, is now at ground and, at the second terminal $V_{SS}$, in lieu of ground, there is now a negative DC voltage of, for example, $-3$ V. In the operation of the circuit shown in FIG. 1c, which operation is identical with that of the circuits shown in FIGS. 1a and 1b, a difference of potential of $-1$ V is developed at the terminals of the resistor R, that is to say, that point 2 is at $-4$ V.

FIG. 3 shows an example of an integrated circuit by which the negative voltage $V_G$ generated by a bias stage according to the invention, especially in accordance with FIG. 1a or FIG. 1b, may be used to advantage.

The circuit shown in FIG. 3 represents two stages of an integrated circuit. The first stage is a bias stage comprising a power transistor T whose source is connected to ground through an inductor $L_2$, the drain to a DC supply voltage, for example, $V_{DD}$, $+3$ V through an inductor $L_1$, and whose gate is biased relative to ground through a large resistor having a resistance of, for example, 10 kΩ. This stage has an input E to which an AC signal $V_{IN}$ is applied which is capable of saturating this transistor T so that a DC voltage $V_{GS} = -1$ V appears at the terminals of the resistor R between the point 3 and ground, that is to say, between the gate and source of the transistor T. The resistor $R_1$ located between the point 2 and point 3 is selected to have a low resistance value relative to that of resistor R.

This DC voltage of $-1$ V is thus tapped from point 3 to bias the gate of the transistor of a second stage. This second stage comprises a resistor transistor T' whose drain is biased by the DC supply voltage $V_{DD}$ through an inductor $L'_1$, and whose source is connected to ground through an inductor $L'_2$. The gate voltage of the first transistor T is tapped from point 3 of the first transistor stage and is coupled to the gate of the second transistor stage (to point 4) by a resistor R2 having a large resistance value.

I claim:

1. A circuit for processing an AC signal comprising: a first stage including a first active element biased with a first bias voltage ($V_{DD}$) applied between its first main electrode and its second main electrode, and biased with a second bias voltage ($V_G$) applied between its control electrode and its second main electrode, said control electrode also receiving the AC signal, the first active element being of the type in which, when in operation, normally no bias current flows in the control electrode, wherein the second DC bias voltage is generated at the terminals of a resistor coupled to the control electrode and to the second main electrode of the first active element by applying to the control electrode an AC power signal at a level which is sufficient to activate the rectifier properties of the first active element between its control electrode and its second main electrode.

2. A circuit as claimed in claim 1, wherein a generator of the AC power signal to be applied to the control electrode of the first active element is the generator itself of the AC signal to be processed.

3. A circuit as claimed in claim 1, wherein a generator of the AC power signal to be applied to the control electrode of the first active element comprises an auxiliary generator.

4. A circuit as claimed in claim 3, wherein the AC power signal has a frequency equal to or lower than that of the operating frequency of the AC signal.

5. A circuit as claimed in claim 4, which further comprises a filter for eliminating signals transmitted by the first stage of the circuit with frequencies other than the operating frequency of the AC signal.

6. A circuit as claimed in claim 1, wherein the first bias voltage supplied between the two main electrodes of the first active element is positive, and the generated second DC bias voltage is negative, the first main electrode being positive and the second main electrode being connected to ground.

7. A circuit as claimed in claim 1, wherein the first bias voltage applied between the two main electrodes is negative, and the generated second DC bias voltage is more negative than the first bias voltage, the first main electrode being connected to ground and the second main electrode being negative.

8. A circuit as claimed in claim 1, wherein the operating frequency of the AC signal is a very high frequency signal, and the first active element includes a power transistor and the first bias voltage is applied to the main electrodes via at least one inductor.

9. A circuit as claimed in claim 8, wherein the second DC bias voltage generated at the terminals of the resistor is tapped off for biasing a second active element in a second stage of the circuit.

10. A circuit as claimed in claim 2, wherein the AC power signal has a frequency equal to or lower than that of the operating frequency of the AC signal.

11. A circuit as claimed in claim 1, wherein said AC signal has an operating frequency and the circuit further comprises a filter for eliminating signals transmitted by the first stage of the circuit with frequencies other than the operating frequency of the AC signal.

12. A circuit as claimed in claim 11, wherein the first bias voltage supplied between the two main electrodes of the first active element is positive, and the generated second DC bias voltage is negative, the first main electrode being positive and the second main electrode being connected to ground.

13. A circuit as claimed in claim 11, wherein the first bias voltage applied between the two main electrodes is negative, and the generated second DC bias voltage is more negative than the first bias voltage, the first main electrode being connected to ground and the second main electrode being negative.

14. A circuit as claimed in claim 1, wherein the second DC bias voltage generated at the terminals of the resistor is tapped off for biasing a second active element in a second stage of the circuit.

15. A circuit as claimed in claim 11, wherein the operating frequency of the AC signal is a very high frequency signal, and the first active element includes a power transistor and the first bias voltage is applied to the main electrodes of the power transistor via a plurality of inductors.

16. A combination amplifier/bias voltage generator comprising:

first and second DC supply voltage terminals, a transistor having first and second main electrodes coupled to said first and second DC supply voltage terminals, respectively, thereby to bias the transistor with a first DC bias voltage, said transistor being of a type in which, in normal operation, a bias current does not flow via its control electrode, an input terminal coupled to the transistor control electrode for supplying a high frequency AC signal thereto, an output terminal coupled to one main electrode of the transistor, and a resistor coupled to the control electrode and to the second main electrode of the transistor whereby an AC power signal at said input terminal of a level sufficient to saturate the transistor develops a second DC bias voltage across said resistor.

17. The combination amplifier/bias voltage generator as claimed in claim 16 further comprising an auxiliary generator coupled to said input terminal for supplying said AC power signal thereto, the frequency of said AC power signal being lower than the frequency of said high frequency AC signal.

18. The combination amplifier/bias voltage generator as claimed in claim 16 wherein said high frequency AC signal also is operative as the AC power signal.

19. The combination amplifier/bias voltage generator as claimed in claim 16 wherein said first DC supply voltage terminal is positive relative to the second DC supply voltage terminal and the second DC bias voltage is negative, and means for supplying said second DC bias voltage to a further circuit to bias at least one transistor therein.

20. The combination amplifier/bias voltage generator as claimed in claim 16 further comprising at least one inductor coupled in series circuit with said transistor to said first and second DC supply voltage terminals, and wherein said transistor comprises a field effect transistor and said resistor is directly connected to the gate and source electrodes thereof.

* * * * *